United States Patent
Xu

(10) Patent No.: US 11,923,484 B2
(45) Date of Patent: Mar. 5, 2024

(54) METHOD OF MANUFACTURING A WHITE LIGHT EMITTING DEVICE COMPRISING MULTIPLE PHOTOLUMINESCENCE MATERIALS

(71) Applicant: Bridgelux, Inc., Fremont, CA (US)

(72) Inventor: Tao Xu, Fremont, CA (US)

(73) Assignee: Bridgelux, Inc., Fremont, CA (US)

( * ) Notice: Subject to any disclaimer, the term of this patent is extended or adjusted under 35 U.S.C. 154(b) by 516 days.

(21) Appl. No.: 17/222,077

(22) Filed: Apr. 5, 2021

(65) Prior Publication Data
US 2021/0234074 A1 Jul. 29, 2021

Related U.S. Application Data

(62) Division of application No. 16/429,303, filed on Jun. 3, 2019, now Pat. No. 10,971,659.

(51) Int. Cl.
*H01L 33/50* (2010.01)
*H01L 25/075* (2006.01)
*H01L 33/62* (2010.01)

(52) U.S. Cl.
CPC ........ *H01L 33/504* (2013.01); *H01L 25/0753* (2013.01); *H01L 33/62* (2013.01); *H01L 2933/0041* (2013.01)

(58) Field of Classification Search
CPC ............... H01L 33/504; H01L 25/0753; H01L 2933/0041
See application file for complete search history.

(56) References Cited

U.S. PATENT DOCUMENTS

| | | | |
|---|---|---|---|
| 10,371,325 B1 * | 8/2019 | Yuan | H01L 33/08 |
| 10,468,564 B1 | 11/2019 | Zhao et al. | |
| 2013/0063020 A1 | 3/2013 | Daicho | |
| 2019/0234581 A1 * | 8/2019 | Iwakura | H01L 25/0753 |

* cited by examiner

Primary Examiner — Wasiul Haider
(74) Attorney, Agent, or Firm — CrossPond Law

(57) ABSTRACT

An exemplary method of manufacturing a white light emitting device may include providing first LEDs and second LEDs operable to generate excitation light having a dominant wavelength in a range from 440 nm to 480 nm; providing a first photoluminescence material which generates light having a peak emission wavelength in a range from 500 nm to 590 nm; providing a second photoluminescence material which generates light having a peak emission wavelength in a range from 600 nm to 650 nm; disposing the second photoluminescence material over and into direct contact with the second LED; and disposing the first photoluminescence material over the first and second LEDs.

20 Claims, 5 Drawing Sheets

SECTION A-A

SECTION B-B

METHOD OF MANUFACTURING A WHITE LIGHT EMITTING DEVICE COMPRISING MULTIPLE PHOTOLUMINESCENCE MATERIALS

CROSS-REFERENCE TO RELATED APPLICATIONS

This application is a divisional of U.S. patent application Ser. No. 16/429,303, filed on Jun. 3, 2019, which is hereby incorporated by reference in its entirety.

FIELD OF THE INVENTION

Embodiments of the present invention are directed to white light emitting devices; in particular, although not exclusively, to white light emitting devices comprising multiple photoluminescence materials. More particularly, although not exclusively, embodiments concern white light emitting devices comprising first and second solid-state light emitters, LEDs, covered by first and second photoluminescence materials.

BACKGROUND OF THE INVENTION

White light emitting LEDs ("white LEDs") include one or more photoluminescence materials (typically inorganic phosphor materials), which absorb a portion of the excitation light (typically blue or red) emitted by the LED and re-emit light of a different color (wavelength). The portion of the excitation light generated by the LED that is not absorbed by the photoluminescence material combined with the light emitted by the photoluminescence material provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps.

One form of white light emitting devices is Chip on Board (COB) in which multiple LED Chips (Dies) are located on a substrate before one or more photoluminescence materials is disposed thereon. Typically, a COB white LED comprises blue LED Chips which are covered by a mixture of red and green/yellow photoluminescence materials. However, COB white LEDs can suffer from low luminous efficacy.

Some white light emitting LEDs comprise red LED Chips that do not include phosphor/photoluminescence materials. More particularly, the red LED Chips do not involve wavelength conversion to generate red light. While white light emitting LEDs comprising red LED Chips are considered to be relatively efficient compared with other forms, they can suffer from poor thermal stability; that is, they can exhibit poor color stability with changes in temperature; due to blue and red LED chips having different thermal characteristics.

The present invention intends to address and/or overcome the limitations discussed above by presenting new designs and methods not hitherto contemplated nor possible by known constructions. More particularly, there is a need for a white light emitting device that exhibits improved luminous efficacy and thermal stability.

SUMMARY OF THE INVENTION

According to an aspect of the present invention, there is provided a white light emitting device comprising: first and second LEDs operable to generate excitation light having a dominant wavelength in a range from 440 nm to 480 nm and mounted on a substrate; a first photoluminescence material which generates light having a peak emission wavelength in a range from 500 nm to 590 nm; and a second photoluminescence material which generates light having a peak emission wavelength in a range from 600 nm to 650 nm, wherein the first LED is covered by the first photoluminescence material, and the second LED is covered by the first and second photoluminescence materials. It may be that the first LED is covered by the first photoluminescence material only, and the second LED is covered by both the first and second photoluminescence materials.

The provision of a white light emitting device formed in accordance with the invention that comprises a combination of a first and second photoluminescence material exhibits improved luminous efficacy and thermal stability compared with known constructions. More particularly, the arrangement in which the first LED is covered by the first photoluminescence material, and the second LED is covered by the first and second photoluminescence materials converts the blue light into red light more effectively. That is the majority of the blue excitation light from the second LED is converted by the second photoluminescence material to light having a peak emission wavelength in a range from 600 nm to 650 nm, that is red light. White light is thus generated from the combination of the unconverted blue excitation light from the first and second LEDs, the light having a peak emission wavelength in a range from 500 nm to 590 nm generated by the first photoluminescence material, and the light having a peak emission wavelength in a range from 600 nm to 650 nm generated by the second photoluminescence material.

It may be that the first photoluminescence material covers the light emitting faces of the first LED. More particularly, the first photoluminescence material may cover the faces opposite and adjacent the substrate on which the first LED is mounted. This may improve the uniformity of light emission from the first LED, for example.

The first and second photoluminescence materials may cover the light emitting faces of the second LED. More particularly, the first and second photoluminescence materials may cover the faces opposite and adjacent the substrate on which the second LED is mounted. This may improve the uniformity of light emission from the second LED, for example. This may also improve luminous efficacy since more of the blue excitation light will be exposed to the first and second photoluminescence materials leading to improved levels of converted light having a peak emission wavelength ranging from 500 nm to 590 nm and from 600 nm to 650 nm.

The first photoluminescence material may be directly in contact with the first LED. This may improve luminous efficacy since more of the blue excitation light will be exposed to the first photoluminescence material leading to improved levels of converted light having a peak emission wavelength ranging from 500 nm to 590 nm.

In some embodiments, the first photoluminescence material may be located remotely to the first and second LEDs. It may be that another material is located between the first photoluminescence material and the first and second LEDs, for instance. This enables the white light emitting device of the present invention to be more versatile with regard to the different types of photoluminescence materials or other materials that it includes.

The first photoluminescence material may be in the form of a component. This may allow retro-fitting of such a component so that the white light emitting device can be assembled and disassembled more easily. It may also allow simple replacement of the component having the first photoluminescence material with a different first photoluminescence material to achieve a desired color temperature or luminous efficacy for instance.

The second photoluminescence material may be directly in contact with the second LED. This may improve luminous efficacy since the second photoluminescence material will be exposed to more of the blue excitation light leading to improved levels of converted light having a peak emission wavelength ranging from 600 nm to 650 nm.

The first photoluminescence material may generate light having a peak emission wavelength in a range from 520 nm to 530 nm.

The second photoluminescence material may generate light having a peak emission wavelength in a range from 620 nm to 635 nm.

It may be that the first photoluminescence material comprises a first phosphor material and/or the second photoluminescence material comprises a second phosphor material.

The first photoluminescence/phosphor material may be excitable to generate white light having a correlated color temperature of 5000K to 6500K. Similarly, the second photoluminescence/phosphor material may be excitable to, in combination with the first phosphor material, generate white light having a correlated color temperature of 2700K to 3500K. In this way, the white light emitting device may be color tunable.

The first phosphor material may comprise at least one selected from a garnet (YAG) phosphor of general composition $Y_{3-x}(Al_{1-y}Ga_y)_5O_{12}:Ce_x$; $(Y,Ba)_{3-x}(Al_{1-y}Ga_y)_5O_{12}:Ce_x$; a LuAG phosphor of general composition $Lu_{3-x}(Al_{1-y}M_y)_5O_{12}:Ce_x$ where M=Mg, Ca, Sr, Ba, Ga; an orthosilicate phosphor of general composition $A_2SiO_4:Eu$ where A=Mg, Ca, Sr, Ba, $(Sr_{1-x}Ba_x)_2SiO_4:Eu$; and or an oxynitride phosphor of general composition $M_xSi_{12-(m+n)}Al_{m+n}O_nN_{16-n}:Eu$ where M=Mg, Ca and/or Sr.

The second phosphor material may comprise at least one selected from a nitride (CASN) phosphor of general composition $(Ca_{1-x}Sr_x)AlSiN_3:Eu$; a nitride (2:5:8) phosphor of general composition $Ba_{2-x}Sr_xSi_5N_8:Eu$; $MSe_{1-x}S_x:Eu$ where M=Mg, Ca, Sr, Ba, Zn; $CaSe_{1-x}S_x:Eu$, $(Sr_{1-x}M_x)_yEu_zSiO_5$ where M=Ba, Mg, Ca, Zn; a complex fluoride phosphor of general composition $K_2SiF_6:Mn^{4+}$; and $K_2TiF_6:Mn^{4+}$.

It may be that the first photoluminescence material comprises a first quantum dot material and/or the second photoluminescence material comprises a second quantum dot material. A quantum dot (QD) is a portion of matter (e.g. semiconductor) whose excitons are confined in all three spatial dimensions that may be excited by radiation energy to emit light of a particular wavelength or range of wavelengths. QDs can comprise different materials, for example cadmium selenide (CdSe). The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). On the other hand, green QDs, which are smaller in size can absorb and emit photons of a relatively higher energy (shorter wavelength). Examples of suitable QDs can include: CdZnSeS (cadmium zinc selenium sulfide), $Cd_xZn_{1-x}Se$ (cadmium zinc selenide), $CdSe_xS_{1-x}$ (cadmium selenium sulfide), CdTe (cadmium telluride), $CdTe_xS_{1-x}$ (cadmium tellurium sulfide), InP (indium phosphide), $In_xGa_{1-x}P$ (indium gallium phosphide), InAs (indium arsenide), $CuInS_2$ (copper indium sulfide), $CuInSe_2$ (copper indium selenide), $CuInSxSe_{2-x}$ (copper indium sulfur selenide), $CuIn_xGa_{1-x}S_2$ (copper indium gallium sulfide), $CuIn_xGa_{1-x}Se_2$ (copper indium gallium selenide), $CuIn_xAl_{1-x}Se_2$ (copper indium aluminum selenide), $CuGaS_2$ (copper gallium sulfide) and $CuInS_{2-x}ZnS_{1-x}$ (copper indium selenium zinc selenide). The optical properties of the core nanocrystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for $CuInS_2$ quantum dots, the core/shell nanocrystals can be synthesized using the formula of $CuInS_2$/ZnS, $CuInS_2$/CdS, $CuInS_2$/$CuGaS_2$, $CuInS_2$/$CuGaS_2$/ZnS and so on.

The white light emitting device may comprise a plurality of first and second LEDs. For instance, the plurality of first and second LEDs may be in the form of symmetrical arrays. Symmetrical arrays may improve the uniformity of light emission by the white light emitting device. More particularly, the plurality of first and second LEDs may be configured such that their arrays are symmetrically/evenly distributed.

The plurality of first and second LEDs may be in the form of asymmetrical arrays. Despite this, the white light emitting device exhibits improved luminous efficacy and does not suffer from reduced uniformity by way of the configuration of the first LED being covered by the first photoluminescence material, and the second LED being covered by the first and second photoluminescence materials.

Since the first and second LEDS each comprise blue LEDs, the first and second LEDs may comprise the same drive current, which provides a simplified and robust system leading to improved efficacy.

The white light emitting device may comprise a first string having first and second LEDs in a ratio of 0:1 to 1:0, and a second string having first and second LEDs in a ratio of 0:1 to 1:0. and wherein the same voltage is applied to the first and second strings—compared with red LEDs which have different drive characteristics.

Advantageously, the same power may be applied to the first and second strings, thereby providing a simplified and robust system. This is because the present invention may utilize all blue LEDs (including phosphor coated red for instance). For example, with a known device comprising traditional blue and red LEDs, it becomes necessary to provide different power to the strings based on the different drive characteristics blue and red LEDs and thus depending on the number of red LEDs within a string. Since all the LEDs according to the present invention have the same thermal characteristics—the system produces a more stable color output with changes in temperature compared with known constructions.

The power applied to the first and second strings may be independently controllable. The white light emitting device may thus be color tunable.

The first and/or second LEDs may be in the form of a flip chip, vertical chip or lateral chip.

The white light emitting device may comprise a diffusing layer. The diffusing layer may improve the color uniformity, particularly color over angle, of light emission by the white light emitting device.

The diffusing layer may be in direct contact with the first photoluminescence material. It may be that the diffusing layer comprises a light transmissive material and light scattering particles. Enhanced color uniformity is particularly advantageous when the device is used in large beam optics. Moreover, the amount of photoluminescence material used may also be reduced thereby providing a more cost-effective manner of manufacturing the white light emitting device. This is because the diffusing layer comprising light scattering particles increases the probability that a photon will result in the generation of photoluminescence light by directing light back into the first or second photoluminescence materials. Thus, the amount of photoluminescence material required to generate a given color temperature of light can be reduced since more of the blue excitation light is converted to photoluminescence light owing to the diffusing layer.

In embodiments, the substrate comprises a circuit board. For example, the substrate may comprise a ceramic substrate or metal core printed circuit board.

In embodiments, the white light emitting device described herein may be a tunable white light emitting device.

According to another aspect, the present invention encompasses a method of manufacturing a white light emitting device, comprising the steps of: providing first and second LEDs operable to generate excitation light having a dominant wavelength in a range from 440 nm to 480 nm; providing a first photoluminescence material which generates light having a peak emission wavelength in a range from 500 nm to 590 nm; providing a second photoluminescence material which generates light having a peak emission wavelength in a range from 600 nm to 650 nm; disposing the second photoluminescence material over the second LED; and disposing the first photoluminescence material over the first and second LEDs.

The method may comprise having a plurality of first and second LEDs.

The method may comprise the step of disposing a diffusing layer over the first photoluminescence material.

In another aspect, the present invention envisages a white light emitting device comprising: a first LED operable to generate excitation light having a dominant wavelength in a range from 440 nm to 480 nm; a first photoluminescence material which generates light having a peak emission wavelength in a range from 500 nm to 590 nm; and a photoluminescence converted LED operable to generate light having a peak emission wavelength in a range from 600 nm to 650 nm, said photoluminescence converted LED comprising a second LED operable to generate excitation light and a second photoluminescence material that covers the light emitting faces of the second LED; and wherein the first photoluminescence material covers the first LED and the photoluminescence converted LED.

According to another aspect, the present invention comprehends a white light emitting device comprising: a first LED operable to generate excitation light having a dominant wavelength in a range from 440 nm to 480 nm; a first photoluminescence material which generates light having a peak emission wavelength in a range from 500 nm to 590 nm; and a photoluminescence converted LED operable to generate light having a peak emission wavelength in a range from 600 nm to 650 nm, said photoluminescence converted LED comprising a second LED operable to generate excitation light having a dominant wavelength in a range from 440 nm to 480 nm and a second photoluminescence material which generates light having a peak emission wavelength in a range from 600 nm to 650 nm and covers the light emitting faces of the LED; and wherein the first photoluminescence material covers the first LED and the photoluminescence converted LED.

The phosphor converted LED may generate light with a peak emission wavelength in a range from 600 nm to 650 nm.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1A:
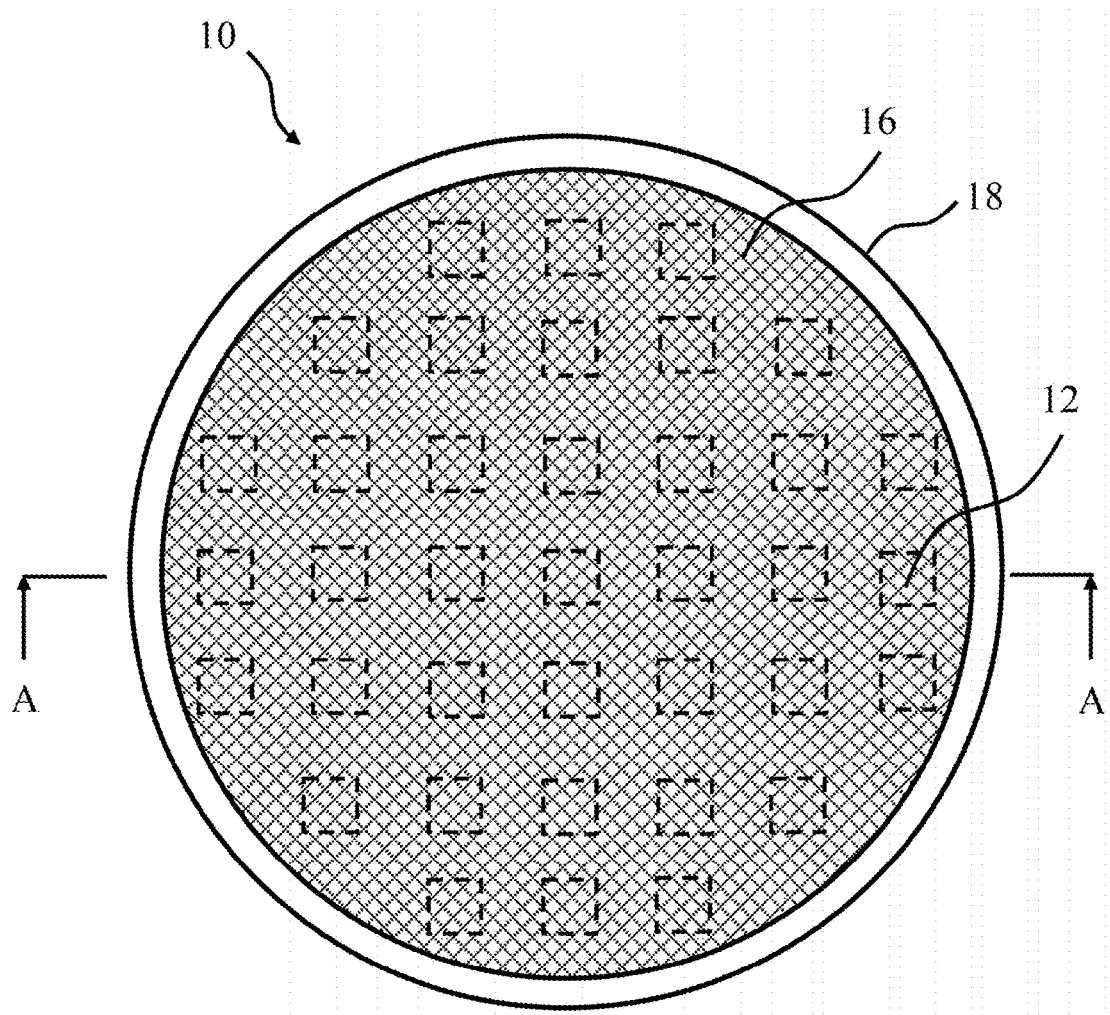
FIG. 1A is a plan view of a known white light emitting device.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification like reference numerals are used to denote like parts.

A known white light emitting device 10 will now be described with reference to FIGS. 1A and 1B.

The known white light emitting device 10 comprises LEDs dies 12 disposed on a substrate 14, and a photoluminescence material mixture 16 disposed over LEDs dies 12.

Figure 1B:
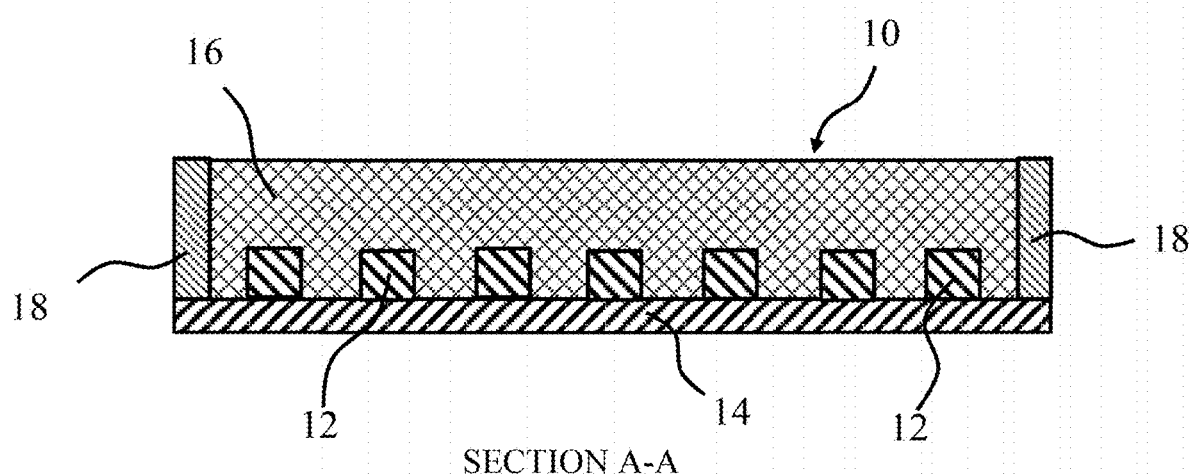
FIG. 1B is cross sectional side view through A-A.

More particularly, FIG. 1A shows a plan view of a known COB light emitting device 10, and FIG. 1B, shows a cross section side view through A-A (of FIG. 1A). The known light emitting device 10 has a circular shape. Thus, the circular substrate 14 is planar and disk shaped. The circular substrate 14 is a metal core printed circuit board (MCPCB). Forming a COB arrangement, 7 arrays (rows) of blue LED dies 12 are evenly distributed on the circular substrate 14 in the form of a square array. The circular substrate 14 also comprises about its entire perimeter a wall 18 which encloses all the arrays of blue LED dies 12.

Typically, the photoluminescence material mixture 16 comprises a homogenous mixture of cerium-activated yellow garnet (YAG) phosphor having a general composition $Y_3(Al,Ga)_5O_{12}$:Ce and a europium-activated red-emitting nitride (CASN) phosphor having a general composition $CaAlSiN_3$:$Eu^{2+}$. Blue excitation light from the blue LED dies 12 is converted to yellow and red light by the $Y_3(Al,Ga)_5O_{12}$:Ce and $CaAlSiN_3$:$Eu^{2+}$ phosphors respectively. The combination of the yellow, red and unconverted blue light generates white light.

The photoluminescence material mixture 16 is deposited onto the circular substrate 14 inside the wall 18 and completely covers the blue LED dies 12. The known light emitting device 10 can suffer from low luminous efficacy.

Some white light emitting LEDs comprise red LED dies that do not include phosphor/photoluminescence materials. More particularly, the red LED dies do not involve wavelength conversion to generate red light. While white light emitting LEDs comprising red LED dies are considered to be relatively efficient compared with other forms, they suffer from poor thermal stability; that is, they can exhibit poor color stability with changes in temperature.

Figure 2A:
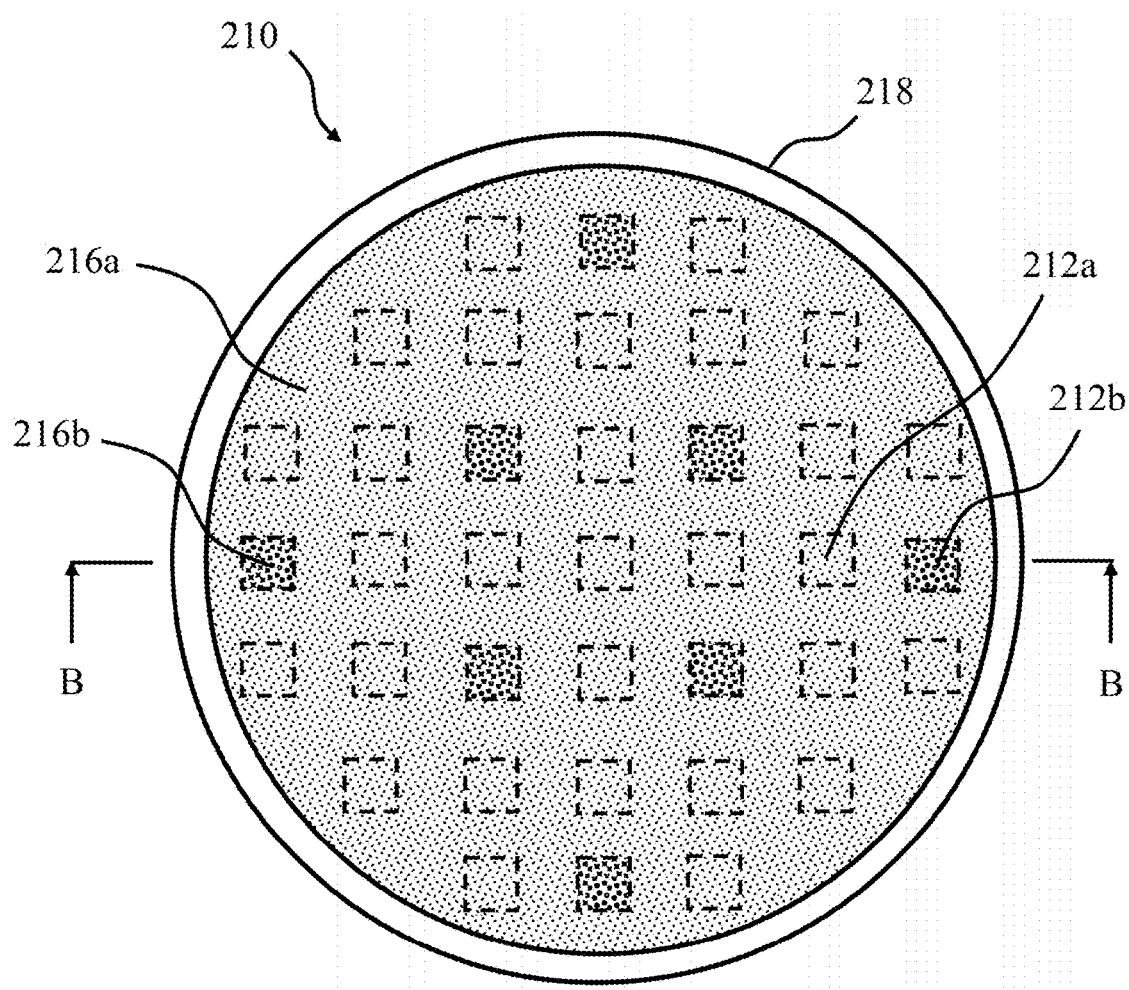
FIG. 2A is a plan view of a white light emitting device in accordance with an embodiment of the invention.
Figure 2B:
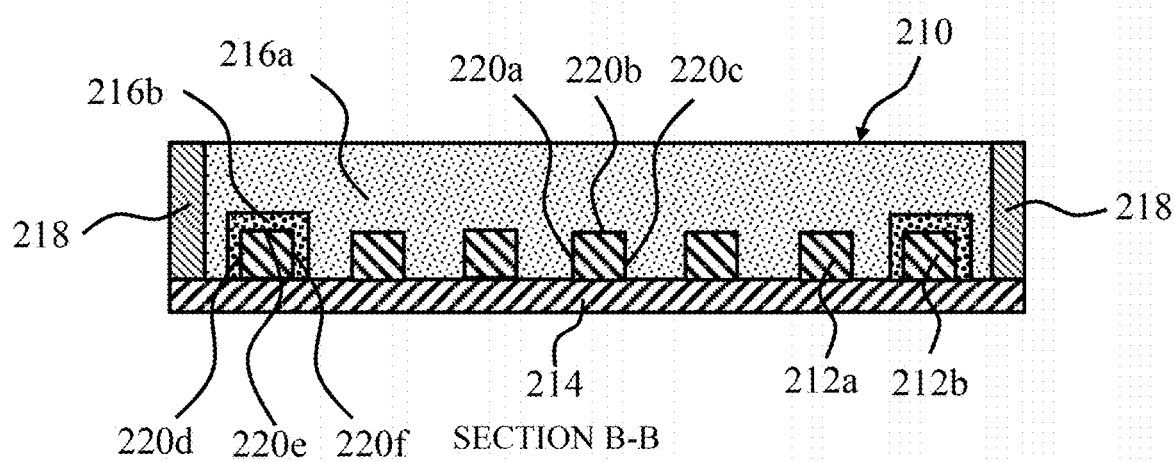
FIG. 2B is cross sectional side view through B-B.

Referring now to FIGS. 2A and 2B, there is described a white light emitting device 210 formed in accordance with the present invention. One of the main differences between the white light emitting device 210 and the known white light emitting device 10 of FIG. 1 is that the white light emitting device 210 does not comprise a photoluminescence material mixture 16 in the same way as the known white light emitting device 10 of FIG. 1. Rather, in the white light emitting device 210 the yellow and red phosphors are provided in respective separate layers, rather than a mixture as shown in FIG. 1.

The white light emitting device 210 comprises first LED dies (InGaN—indium gallium nitride dies) 212a and second LED dies (InGaN—indium gallium nitride dies) 212b disposed on a substrate 214, and a first photoluminescence material 216a and a second photoluminescence material 216b.

More particularly, FIG. 2A shows a plan view of a COB light emitting device 210, and FIG. 2B, shows a cross section side view through B-B (of FIG. 2A). The white light emitting device 210 has a circular shape. Thus, the circular substrate 214 is planar and disk shaped. The circular substrate 214 is a metal core printed circuit board (MCPCB). Forming a COB arrangement, 7 arrays (rows) of blue first LEDs 212a and second LEDs 212b are distributed on the circular substrate 214. The first LEDs 212a and second LEDs 212b are operable to generate excitation light having a dominant wavelength in a range from 440 nm to 480 nm. In the embodiment illustrated, there are 29 first LEDs 212a and 8 second LEDs 212b that are evenly distributed on the circular substrate 214 in the form of a square array (symmetrical array). The second LEDs 212b are evenly distributed among the first LEDs 212a. The circular substrate 214 also comprises about its entire perimeter a wall 218 which surrounds all the arrays of first LEDs 212a and second LEDs 212b.

The first photoluminescence material 216a comprises a cerium-activated yellow garnet (YAG) phosphor having a general composition $Y_3(Al,Ga)_5O_{12}$:Ce dispersed in silicone. The first photoluminescence material 216a generates light having a peak emission wavelength in a range from 500 nm to 590 nm. The first photoluminescence material 216a is excitable to generate, in combination with unconverted blue excitation light, white light having a correlated color temperature of 5000K to 6500K ("cool white").

The second photoluminescence material 216b can comprise a europium-activated red-emitting nitride (CASN) phosphor having a general composition $CaAlSiN_3$:$Eu^{2+}$ dispersed in silicone. The second photoluminescence material 216b generates light having a peak emission wavelength in a range from 600 nm to 650 nm. The second photoluminescence material 216b is excitable to generate, in combination with unconverted blue excitation light and photoluminescence generated light by the first photoluminescence material, white light having a correlated color temperature of 2700K to 3500K ("warm white").

In this embodiment, the second LEDs 212b are coated with the second photoluminescence material 216b. The second LEDs are individually coated. The coating may be in the form of chip scale packaging (CSP) or each individual second LED 212b may be coated by another suitable method involving depositing the second photoluminescence material 216b thereon.

Following the positioning of the first LEDs 212a, which are uncoated, and second LEDs 212b, which are coated with the second photoluminescence material 216b, on the circular substrate 214—the first photoluminescence material 216a is deposited on the first LEDs 212a and second LEDs 212b inside the wall 218. As best seen in FIG. 2B, this results in the first LEDs 212a being covered by only the first photoluminescence material 216a, and the second LEDs 212b being covered by both the first photoluminescence material 216a and second photoluminescence material 216b. In other embodiments, the first LEDs may be covered by the first photoluminescence material, and the second LEDs may be covered by the first photoluminescence material and second photoluminescence material.

Blue excitation light from the first LEDs 212a is converted to yellow light by the $Y_3(Al,Ga)_5O_{12}$:Ce phosphor in the first photoluminescence material 216a. The majority, if not all, of the blue excitation light from the second LEDs 212b is converted to red light by the $CaAlSiN_3$:$Eu^{2+}$ phosphor in the second photoluminescence material 216b. Any unconverted blue excitation light from the second LEDs 212b is converted to yellow light by the $Y_3(Al,Ga)_5O_{12}$:Ce phosphor in the first photoluminescence material 216a. The combination of the yellow, red and unconverted blue light generates white light.

As seen in FIG. 2B, each of the first LEDs 212a have light emitting faces 220a, 220b, 220c. It will be appreciated that each of the first LEDs 212a also have two additional light emitting faces (not numbered) orthogonal to the light emitting faces 220a and 220c whose emissions are in a direction into and out of the plane of the page as illustrated in FIG. 2B. The same is true for each of the second LEDs 212b. Similarly, each of the second LEDs 212b have light emitting faces 220*d*, 220*e*, 220*f*. The respective light emitting faces 220*a*, 220*c*, 220*d*, 220*f* are sidewardly facing—that is towards the wall 218. The respective light emitting faces 220*b*, 220*e* are upwardly facing—that is along the vertical axes of the respective first and second LEDs 212*a*, 212*b* and orthogonal to the wall 218 and light emitting faces 220*a*, 220*c*, 220*d*, 220*f*. In this embodiment, the first photoluminescence material 216*a* covers the light emitting faces 220*a*, 220*b*, 220*c* of the first LEDs 212*a*. In other words, the first photoluminescence material 216*a* covers the light emitting faces 220*b* opposite the circular substrate 214 on which the first LEDs 212*a* are mounted; and the first photoluminescence material 216*a* covers the light emitting faces 220*a*, 220*c* adjacent the circular substrate 214 on which the first LEDs 212*a* are mounted. This can improve the uniformity of light emission from the first LEDs. In this embodiment, the first photoluminescence material 216*a* is directly in contact with the first LEDs 212*a*. This can improve luminous efficacy since more of the blue excitation light is incident on the first photoluminescence material 216*a* leading to improved levels of converted light having a peak emission wavelength ranging from 500 nm to 590 nm.

Similarly, the first and second photoluminescence materials 216*a*, 216*b* cover the light emitting faces 220*d*, 220*e*, 220*f* of the second LEDs 212*b*. The second photoluminescence material 216*b* is directly in contact with the second LEDs 212*b*, and the first photoluminescence material 216*a* overlays the second photoluminescence material 216*b*. In this embodiment, therefore, the blue excitation light emitted from the second LEDs 212*b* traverses the second photoluminescence material 216*b* before reaching the first photoluminescence material 216*a*. The second photoluminescence material 216*b* covers the light emitting faces 220*e* opposite the circular substrate 214 on which the second LEDs 212*b* are mounted; and the second photoluminescence material 216*b* covers the light emitting faces 220*d*, 220*f* adjacent the circular substrate 214 on which the second LEDs 212*b* are mounted. This can improve the uniformity of light emission from the second LEDs 212*b*. This also improves luminous efficacy since more of the blue excitation light will be incident on the second photoluminescence material 216*b* leading to improved levels of converted light having a peak emission wavelength ranging from 600 nm to 650 nm.

The provision of the white light emitting device 210 formed in accordance with the invention exhibits improved luminous efficacy and thermal stability compared with known constructions. More particularly, the arrangement in which the first LEDs 212*a* are covered by the first photoluminescence material 216*a*, and the second LEDs 212*b* are covered by the first and second photoluminescence materials 216*a*, 216*b* converts the blue excitation light into red light more effectively. It may be that in some embodiments the majority of the blue excitation light from the second LEDs 212*b* is converted to light having a peak emission wavelength in a range from 600 nm to 650 nm by the second photoluminescence materials 216*b*. White light is thus generated from the combination of the unconverted blue excitation light from the first and second LEDs 212*a*, 212*b*, the light having a peak emission wavelength in a range from 500 nm to 590 nm generated by the first photoluminescence material 216*a*, and the light having a peak emission wavelength in a range from 600 nm to 650 nm generated by the second photoluminescence material 216*b*.

Optionally, the white light emitting device 210 may comprise a diffusing layer (not shown). The diffusing layer may improve the color uniformity of light emission by the white light emitting device 210. The diffusing layer may be in direct contact with the first photoluminescence material 216*a*. It may be that the diffusing layer comprises a light transmissive material and light scattering particles. Enhanced color uniformity is particularly advantageous when the device is used in large beam optics. Moreover, the amount of photoluminescence material used may also be reduced thereby providing a more cost-effective manner of manufacturing the white light emitting device 210. This is because the diffusing layer comprising light scattering particles increases the probability that a photon will result in the generation of photoluminescence light by directing blue excitation light back into the first or second photoluminescence materials 216*a*, 216*b*. Thus, the amount of photoluminescence material required to generate a given color temperature of light can be reduced since more of the blue excitation light is converted to photoluminescence light owing to the diffusing layer.

Figure 3:
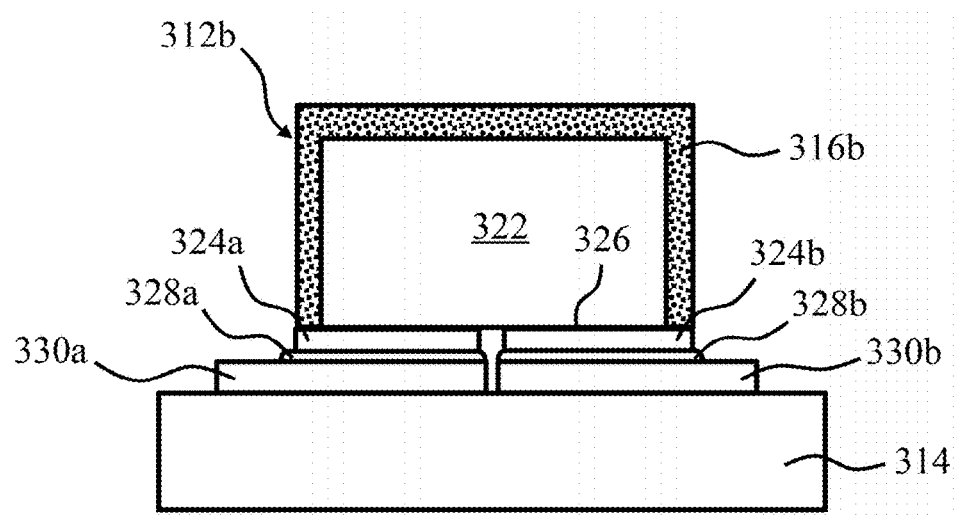
FIG. 3 is a schematic representation of a flip-chip second LED formed in accordance with an embodiment of the invention.

Referring now to FIG. 3, there is shown a schematic representation of a flip-chip second LED 312*b* formed in accordance with an embodiment of the invention.

The flip-chip second LED 312*b* comprises an InGaN (indium gallium nitride) die 322 coated with a second photoluminescence material 316*b*. The InGaN (indium gallium nitride) die 322 is operable to generate excitation light having a dominant wavelength in a range from 440 nm to 480 nm. The second photoluminescence material 316*b* is operable to generate light having a peak emission wavelength in a range from 600 nm to 650 nm. The die 322 comprises an n-electrode 324*a* and a p-electrode 324*b* at its base 326. The n-electrode 324*a* and a p-electrode 324*b* are connected to two corresponding bonding pads 328*a*, 328*b*. In turn, bonding pad 328*a* is seated on a contact pad 330*a*, while the other bonding pad 328*b* is seated on a contact pad 330*b*. The contact pads 330*a*, 330*b* are mounted on a planar substrate 314.

Figure 4:
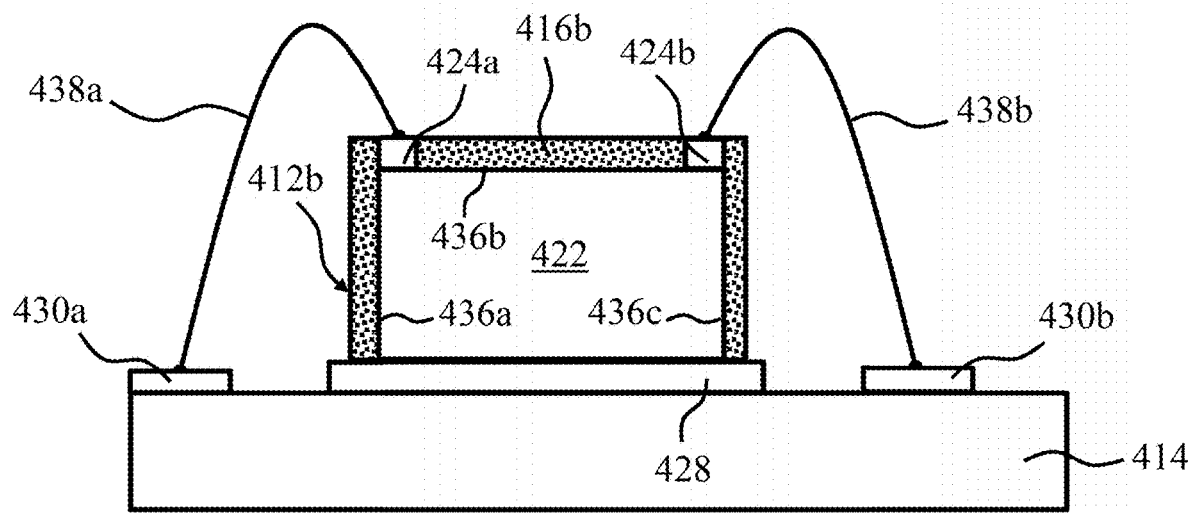
FIG. 4 is a schematic representation of a lateral-chip second LED formed in accordance with an embodiment of the invention.

Referring to FIG. 4, there is shown a schematic representation of a lateral-chip second LED 412*b* formed in accordance with an embodiment of the invention.

The lateral-chip second LED 412*b* comprises an InGaN (indium gallium nitride) die 422 coated with a second photoluminescence material 416*b* on its upper 436*b* and all side surfaces 436*a*, 436*c* The die 422 is seated on bonding pad 428. The die 422 is operable to generate excitation light having a dominant wavelength in a range from 440 nm to 480 nm. The second photoluminescence material 416*b* is operable to generate light having a peak emission wavelength in a range from 600 nm to 650 nm. The die 422 comprises an n-electrode 424*a* and a p-electrode 424*b* on opposing ends of its upper surface 436*b*. Bond wires 438*a*, 438*b* connect the n-electrode 424*a* and the p-electrode 424*b* to corresponding contact pads 430*a*, 430*b* which are mounted on a planar substrate 414.

Figure 5:
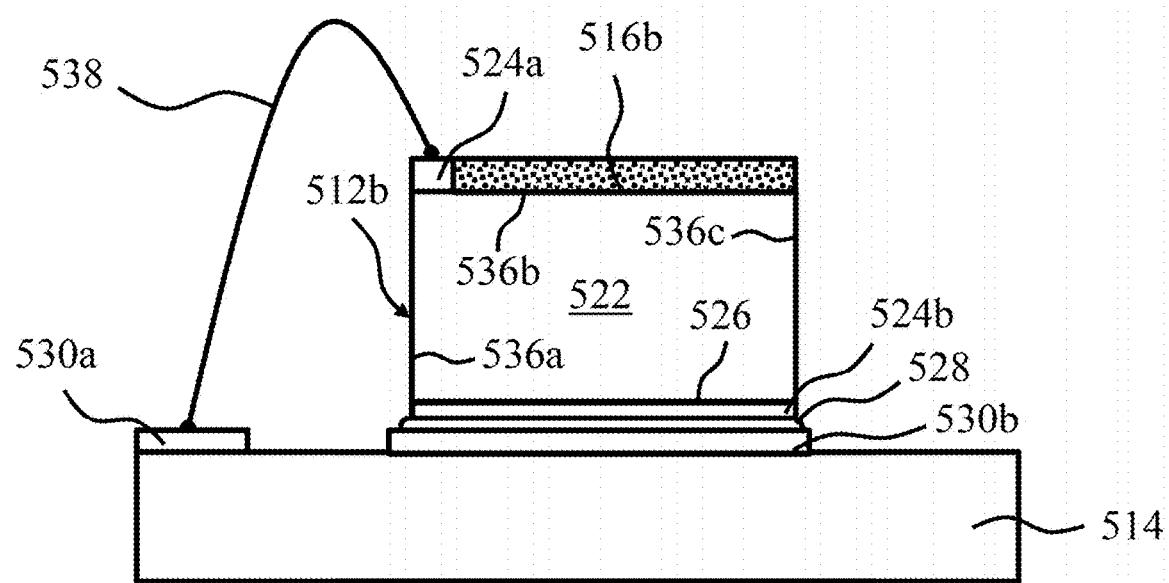
FIG. 5 is a schematic representation of a vertical-chip second LED formed in accordance with an embodiment of the invention.

Referring to FIG. 5, there is shown a schematic representation of a vertical-chip second LED 512*b* formed in accordance with an embodiment of the invention.

The vertical-chip second LED 512*b* comprises an InGaN (indium gallium nitride) die 522 coated with a second photoluminescence material 516*b* on its upper surface 536*b* only. More particularly, the side surfaces 536*a*, 536*c* are not coated with the second photoluminescence material 516*b* since the vertical chip emits light from its upper surface only. The die 522 is operable to generate excitation light having a dominant wavelength in a range from 440 nm to 480 nm. The second photoluminescence material 516*b* is operable to generate light having a peak emission wavelength in a range from 600 nm to 650 nm. The die 522 comprises an n-electrode 524*a* on one end of its upper surface 536b. A bond wire 538a connects the n-electrode 524a to a corresponding contact pad 530a which is mounted on a planar substrate 514. The die 522 comprises a p-electrode 424b at its base 526 which is seated on bonding pad 528. In turn, bonding pad 328 is seated on a contact pad 530b which is mounted on a planar substrate 314.

Figure 6:
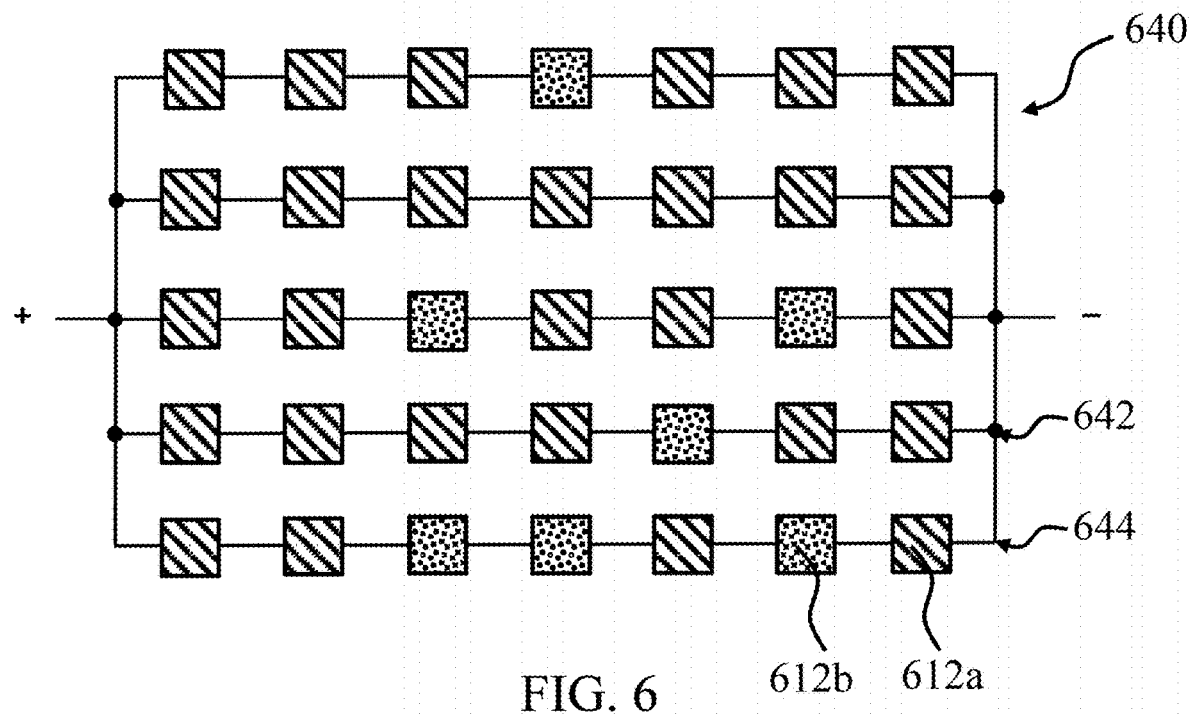
FIG. 6 is a plan view of a circuit configuration of first and second LED arrays in accordance with an embodiment of the invention.

Referring now to FIG. 6, there is shown a circuit configuration 640 of first LED arrays 612a and second LED (coated with a second photoluminescence material) arrays 612b in accordance with an embodiment of the invention. The circuit configuration 640 comprises 5 strings each having an array of 7 serially connected LEDs. There are 28 first LEDs 612a and 7 second LEDs 612b distributed among the configuration 640. More particularly, in the first string there 1 second LED and 6 first LEDs, in the second string 7 first LEDs, in the third string 2 second LEDs, in the forth string 6 first LEDs and 1 second LED and in the fifth string 4 first LEDs and the 3 second LEDs. In this way, a first string 642 can have first LEDs 612a and second LEDs 612b in a ratio of 0:1 to 1:0, and a second string 644 can have first LEDs 612a and second LEDs 612b in a ratio of 0:1 to 1:0. Advantageously, the same voltage is applied to both strings 642, 644.

Figure 7:
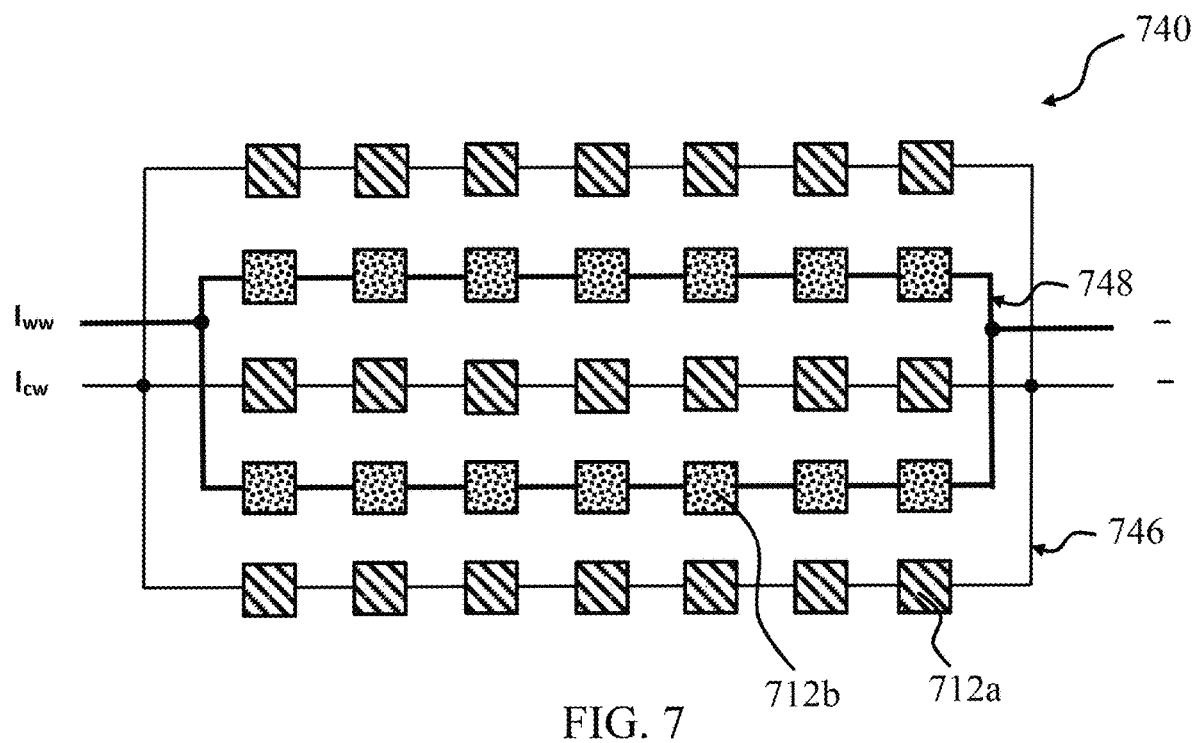
FIG. 7 is a plan view of an alternative circuit configuration of first and second LED arrays in accordance with another embodiment of the invention.

Referring now to FIG. 7, there is shown an alternative circuit configuration 740 of first LED arrays 712a and second LED (coated with a second photoluminescence material) arrays 712b in accordance with another embodiment of the invention. In this embodiment, the alternative circuit configuration 740 comprises a first circuit 746 having 3 parallel connected strings of 7 serially connected first LEDs 712a and a second circuit 748 having 2 parallel connected strings of 7 serially connected second LEDs (coated with a second photoluminescence material) 712b. Having separate circuits, that is a first and second circuit 746, 748, enables the first LEDs 712a and second LEDs 712b to be independently controlled. Thus, a white light emitting device formed in accordance with the invention having such a circuit configuration 740 constitutes a color tunable light emitting device. The first and second LEDs 712a, 712b can comprise the same drive current, which provides a simplified and robust system leading to improved efficacy. Advantageously, the same power can be applied to the first and second circuits 746, 748, thereby providing a simplified and robust system.

Experimental

Figure 8:
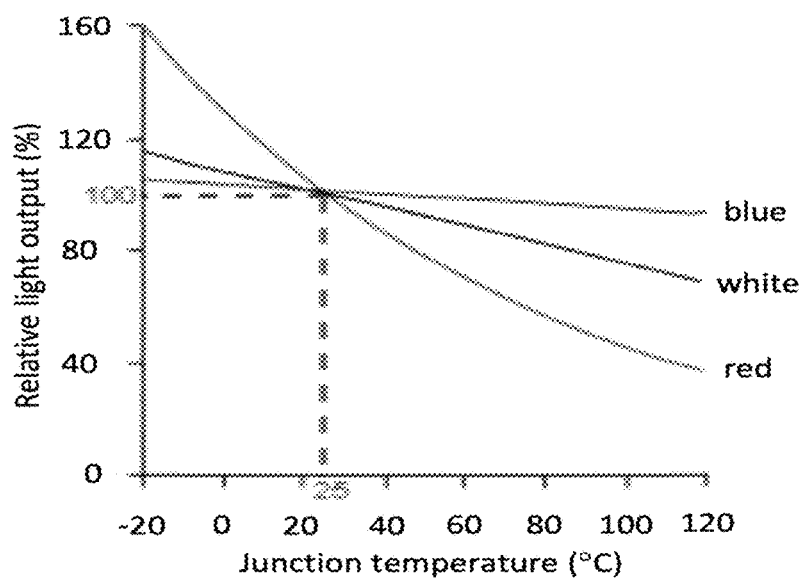
FIG. 8 is a plot showing the thermal stability of red and blue LED chips.

Referring to FIG. 8, there is shown a plot of the thermal stability for red and blue LED chips and a white LED. The plot shows relative light output (%) vs junction temperate (° C.) for red and blue LED chips and a white LED. The plots are normalized at 100% at 25° C. At this point, the red and blue LED chips and white LED have an equal light output. However, it can be seen that as the temperature increases towards 120° C., the relative light output of red LED chips drops to approximately 40% while the relative light output of blue LED chips only drops to approximately 98%. This demonstrates that red LED chips degrade much faster than blue LED chips. It will be appreciated that for white LEDs based on red and blue LED chips the color temperature of white light generated by such LEDs will increase with increasing junction temperature due to relatively quicker decrease in output with temperature of red LED chips compared with blue LED chips resulting in a decrease in the ratio of red to blue light with increasing temperature. Hence, in accordance with a benefit of the present invention, it will be understood that photoluminescence material coated red LED chips (i.e. blue LED chips coated with red phosphor material) have a better thermal color stability than traditional red LED chips.

Experiments 1 and 2 were conducted together with a Control Experiment. The composition of the phosphor layers used in these experiments is shown in Tables 1 and 2.

In Experiment 1, there was provided a white light emitting device which comprised 24 blue LEDs disposed on a circular substrate (COB). A red phosphor layer having the composition of Table 1 was dispensed over 12 of the 24 blue LEDs thereby coating their light emitting faces entirely with the red phosphor layer. A yellow and green phosphor (mixture) layer having the composition of Table 2 was then dispensed over the circular substrate thereby covering the 12 red-phosphor-coated LEDs and the 12 non-coated LEDs.

In Experiment 2, there was provided a white light emitting device which comprised 24 blue LEDs disposed on a circular substrate (COB). A red phosphor layer having the composition of Table 1 was dispensed over all 24 blue LEDs thereby coating their light emitting faces entirely with the red phosphor layer. A yellow and green phosphor (mixture) layer having the composition of Table 2 was then dispensed over the circular substrate thereby covering all the 24 red-phosphor-coated LEDs.

In the Control Experiment, there was provided a white light emitting device which comprised 24 blue LEDs disposed on a circular substrate (COB). A yellow and green phosphor (mixture) layer having the composition of Table 2 was dispensed over the circular substrate thereby covering all the 24 blue LEDs. The blue LEDs were not coated with a red phosphor layer.

TABLE 1 red phosphor layer

| | Phosphor/concentration red phosphor | Silicone/concentration Silicone A | Silicone/concentration Silicone B |
|---|---|---|---|
| Experiment 1 | 5% | 84% | 16% |
| Experiment 2 | 3.5% | 84% | 16% |

TABLE 2 green and yellow phosphor layer

| | green phosphor | yellow phosphor | Silicone | concentration | Weight |
|---|---|---|---|---|---|
| Control | 13.84 | 0.78 | Silicone B | 29.02% | 46.0 mg |
| Experiment 1 | 0.6 | 0.4 | Silicone B | 15.85% | 37.5 mg |
| Experiment 2 | 0.6 | 0.4 | Silicone B | 18.04% | 37.0 mg |

The results of Experiments 1 and 2 and the Control Experiment are shown in Table 3 below. All values in Table 3 are average values.

TABLE 3

Experimental Results

| | Flux (lm) | CIE x | CIE y | CCT (K) | $V_f$ (V) | CRI Ra | CRI R9 | Efficacy (lm/W) |
|---|---|---|---|---|---|---|---|---|
| Control | 925.4 | 0.4349 | 0.4034 | 3029 | 17.17 | 83.4 | 10.7 | 154.0 |
| Experiment 1 | 931.5 | 0.4335 | 0.4015 | 3037 | 17.17 | 82.3 | 11.0 | 155.0 |
| Experiment 2 | 937.1 | 0.4325 | 0.4028 | 3066 | 17.17 | 80.9 | 7.4 | 155.9 |

The current used in all Experiments was 349.9 mA. The efficacy of Experiments 1 and 2 is based on the normalized forward voltage ($V_f$) value of 17.17 of the Control Experiment. A true comparison of the Control Experiment, Experiment 1 and Experiment 2 is thus achieved.

A comparison of the Efficacy between the Control Experiment (154.01 lm/W) and Experiment 1 (155.02 lm/W) shows an improvement of 1.01 lm/W equating to approximately 0.66%. This demonstrates that by covering half of the blue LEDs with the red phosphor layer and then all the blue LEDs with a yellow/green phosphor mixture layer, a superior efficacy is achieved—that is approximately 0.66% better than known constructions (Control Experiment) which is a significant improvement and advantage.

A comparison of the Efficacy between the Control Experiment (154.01 lm/W) and Experiment 2 (155.94 lm/W) shows an improvement of 1.93 lm/W equating to approximately 1.25%. This demonstrates that by covering all of the blue LEDs with the red phosphor layer and then all the blue LEDs with a yellow/green phosphor mixture layer, a superior efficacy is achieved—that is approximately 1.25% better than known constructions (Control Experiment) which is a significant improvement and advantage.

As used in this document, both in the description and in the claims, and as customarily used in the art, the words "substantially," "approximately," and similar terms of approximation are used to account for manufacturing tolerances, manufacturing variations, and manufacturing imprecisions that are inescapable parts of fabricating any mechanism or structure in the physical world.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. The purpose of the Abstract of this document is to enable the U.S. Patent and Trademark Office, as well as readers who are not familiar with patent or legal terms or phraseology, to determine quickly from a cursory inspection the nature and essence of the technical disclosure of the application. The Abstract is not intended to define the invention, nor is it intended to limit to the scope of the invention. The purpose of the clauses of this document is to provide support for claims in any later-file foreign patent applications claiming priority to this document. The clauses are not intended to define the invention, nor are they intended to limit to the scope of the invention. Therefore, the invention is not to be restricted or limited except in accordance with the following claims and their legal equivalents.

CLAUSES

It will be understood that the following clauses form part of the disclosure of the invention defined herein. More particularly, the invention herein may be defined by the combination of the features of the clauses as detailed below, and said clauses may be utilized to amend the combination of the features within the claims of this application.

1. A white light emitting device comprising:
    first and second LEDs operable to generate excitation light having a dominant wavelength in a range from 440 nm to 480 nm and mounted on a substrate;
    a first photoluminescence material which generates light having a peak emission wavelength in a range from 500 nm to 590 nm; and
    a second photoluminescence material which generates light having a peak emission wavelength in a range from 600 nm to 650 nm,
    wherein the first LED is covered by the first photoluminescence material, and the second LED is covered by the first and second photoluminescence materials.
2. The white light emitting device of Clause 1, wherein the first photoluminescence material covers the light emitting faces of the first LED.
3. The white light emitting device of Clause 1 or Clause 2, wherein the first and second photoluminescence materials cover the light emitting faces of the second LED.
4. The white light emitting device of any of Clauses 1 to 3, wherein the first photoluminescence material is directly in contact with the first LED.
5. The white light emitting device of any of Clauses 1 to 3, wherein the first photoluminescence material is located remotely to the first and second LEDs.
6. The white light emitting device of Clause 5, wherein the first photoluminescence material is in the form of a component.
7. The white light emitting device of any of Clauses 1 to 6, wherein the second photoluminescence material is directly in contact with the second LED.
8. The white light emitting device of any of Clauses 1 to 7, wherein the first photoluminescence material generates light having a peak emission wavelength in a range from 520 nm to 530 nm.
9. The white light emitting device of any of Clauses 1 to 8, wherein the second photoluminescence material generates light having a peak emission wavelength in a range from 620 nm to 635 nm.
10. The white light emitting device of any of Clauses 1 to 9, wherein the first photoluminescence material comprises a first phosphor material and/or the second photoluminescence material comprises a second phosphor material.
11. The white light emitting device of Clauses 10, wherein the first phosphor material is excitable to generate white light having a correlated color temperature of 5000K to 6500K.
12. The white light emitting device of Clause 10 or Clause 11, wherein the second phosphor material is excitable to generate white light having a correlated color temperature of 2700K to 3500K.
13. The white light emitting device of Clause 10, wherein the first phosphor material comprises at least one selected from $Y_{3-x}(Al_{1-y}Ga_y)_5O_{12}:Ce_x$; $(Y,Ba)_{3-x}(Al_{1-y}Ga_y)_5O_{12}:Ce_x$; $Lu_{3-x}(Al_{1-y}M_y)_5O_{12}:Ce_x$ where M=Mg, Ca, Sr, Ba, Ga; $A_2SiO_4$:Eu where A=Mg, Ca, Sr, Ba, $(Sr_{1-x}Ba_x)_2SiO_4$:Eu; and $M_xSi_{12-(m+n)}Al_{m+n}O_nN_{16-n}$:Eu where M=Mg, Ca and/or Sr.
14. The white light emitting device of Clause 10, wherein the second phosphor material comprises at least one selected from $(Ca_{1-x}Sr_x)AlSiN_3$:Eu; $Ba_{2-x}Sr_xSi_5N_8$:Eu; $MSe_{1-x}S_x$:Eu where M=Mg, Ca, Sr, Ba, Zn; $CaSe_{1-x}S_x$:

Eu, $(Sr_{1-x}M_x)_yEu_zSiO_5$ where M=Ba, Mg, Ca, Zn; $K_2SiF_6:Mn^{4+}$; and $K_2TiF_6:Mn^{4+}$.

15. The white light emitting device of any of Clauses 1 to 9, wherein the first photoluminescence material comprises a first quantum dot material and/or the second photoluminescence material comprises a second quantum dot material.

16. The white light emitting device of any of Clauses 1 to 15, comprising a plurality of first and second LEDs.

17. The white light emitting device of Clause 16, wherein the plurality of first and second LEDs are in the form of symmetrical arrays.

18. The white light emitting device of Clause 16, wherein the plurality of first and second LEDs are in the form of asymmetrical arrays.

19. The white light emitting device of Clause 16, wherein the first and second LEDs comprise the same drive current.

20. The white light emitting device of Claim 16, comprising a first string having first and second LEDs in a ratio of 0:1 to 1:0, and a second string having first and second LEDs in a ratio of 0:1 to 1:0.

21. The white light emitting device of Clause 20, wherein the same power is applied to the first and second strings.

22. The white light emitting device of Clause 20, wherein the power applied to the first and second strings is independently controllable.

23. The white light emitting device of any of Clauses 1 to 22, wherein the first and/or second LEDs are in the form of a flip chip, vertical chip or lateral chip.

24. The white light emitting device of any of Clauses 1 to 23, comprising a diffusing layer.

25. The white light emitting device of Clause 24, wherein the diffusing layer is in direct contact with the first photoluminescence material.

26. The white light emitting device of Clause 24 or Clause 25, wherein the diffusing layer comprises a light transmissive material and light scattering particles.

27. The white light emitting device of any of Clauses 1 to 26, wherein the substrate comprises a circuit board, optionally a ceramic substrate or metal core printed circuit board.

28. The white light emitting device of any of Clauses 1 to 27, being a tunable white light emitting device.

29. A method of manufacturing a white light emitting device, comprising the steps of:
providing first and second LEDs operable to generate excitation light having a dominant wavelength in a range from 440 nm to 480 nm;
providing a first photoluminescence material which generates light having a peak emission wavelength in a range from 500 nm to 590 nm;
providing a second photoluminescence material which generates light having a peak emission wavelength in a range from 600 nm to 650 nm;
disposing the second photoluminescence material over the second LED; and disposing the first photoluminescence material over the first and second LEDs.

30. The method of Clause 29, comprising a plurality of first and second LEDs.

31. The method of Clause 29 or Clause 30, comprising the step of disposing a diffusing layer over the first photoluminescence material.

32. A white light emitting device comprising:
a first LED operable to generate excitation light having a dominant wavelength in a range from 440 nm to 480 nm;
a first photoluminescence material which generates light having a peak emission wavelength in a range from 500 nm to 590 nm; and
a photoluminescence converted LED operable to generate light having a peak emission wavelength in a range from 600 nm to 650 nm, said photoluminescence converted LED comprising a second LED operable to generate excitation light and a second photoluminescence material that covers the light emitting faces of the second LED; and
wherein the first photoluminescence material covers the first LED and the photoluminescence converted LED.

33. A white light emitting device comprising:
a first LED operable to generate excitation light having a dominant wavelength in a range from 440 nm to 480 nm;
a first photoluminescence material which generates light having a peak emission wavelength in a range from 500 nm to 590 nm; and
a photoluminescence converted LED operable to generate light having a peak emission wavelength in a range from 600 nm to 650 nm, said photoluminescence converted LED comprising a second LED operable to generate excitation light having a dominant wavelength in a range from 440 nm to 480 nm and a second photoluminescence material which generates light having a peak emission wavelength in a range from 600 nm to 650 nm and covers the light emitting faces of the LED; and
wherein the first photoluminescence material covers the first LED and the photoluminescence converted LED.

What is claimed is:

1. A method of manufacturing a white light emitting device, comprising the steps of:
providing first and second LEDs operable to generate excitation light having a dominant wavelength in a range from 440 nm to 480 nm;
providing a first photoluminescence material which generates light having a peak emission wavelength in a range from 500 nm to 590 nm;
providing a second photoluminescence material which generates light having a peak emission wavelength in a range from 600 nm to 650 nm;
disposing the second photoluminescence material over and into direct contact with the second LED; and
disposing the first photoluminescence material over the first and second LEDs.

2. The method of manufacturing of claim 1, wherein the disposing the first photoluminescence material over the first and second LEDs further comprises disposing the first photoluminescence material into direct contact with the first LED.

3. The method of manufacturing of claim 1, wherein the first photoluminescence material generates light having a peak emission wavelength in a range from 520 nm to 530 nm.

4. The method of manufacturing of claim 1, wherein the second photoluminescence material generates light having a peak emission wavelength in a range from 620 nm to 635 nm.

5. The method of manufacturing of claim 1, wherein the first photoluminescence material comprises a first phosphor material and the second photoluminescence material comprises a second phosphor material.

6. The method of manufacturing of claim 5, wherein the first phosphor material is excitable to generate white light having a correlated color temperature of 5000K to 6500K.

7. The method of manufacturing of claim 5, wherein the second phosphor material is excitable to generate white light having a correlated color temperature of 2700K to 3500K.

8. The method of manufacturing of claim 5, wherein the first phosphor material comprises at least one selected from $Y_{3-x}(Al_{1-y}Ga_y)_5O_{12}:Ce_x$; $(Y,Ba)_{3-x}(Al_{1-y}Ga_y)_5O_{12}:Ce_x$; $Lu_{3-x}(Al_{1-y}M_y)_5O_{12}:Ce_x$ where M=Mg, Ca, Sr, Ba, Ga; $A_2SiO_4$:Eu where A=Mg, Ca, Sr, Ba, $(Sr_{1-x}Ba_x)_2SiO_4$:Eu; and $M_xSi_{12-(m+n)}Al_{m+n}O_nN_{16-n}$:Eu where M=Mg, Ca and/or Sr.

9. The method of manufacturing of claim 5, wherein the second phosphor material comprises at least one selected from $(Ca_{1-x}Sr_x)AlSiN_3$:Eu; $Ba_{2-x}Sr_xSi_5N_8$:Eu; $MSe_{1-x}S_x$:Eu where M=Mg, Ca, Sr, Ba, Zn; $CaSe_{1-x}S_x$:Eu, $(Sr_{1-x}M_x)_yEu_zSiO_5$ where M=Ba, Mg, Ca, Zn; $K_2SiF_6:Mn^{4+}$; and $K_2TiF_6:Mn^{4+}$.

10. The method of manufacturing of claim 1, comprising a plurality of first and second LEDs.

11. The method of manufacturing of claim 10, comprising a first string having first and second LEDs in a ratio of 0:1 to 1:0, and a second string having first and second LEDs in a ratio of 0:1 to 1:0.

12. The method of manufacturing of claim 11, further comprising providing a substrate; and a placing the first LEDs and second LEDs on the substrate.

13. The method of manufacturing of claim 11, wherein the placing includes distributing the first LEDs and second LEDs substantially evenly on the substrate.

14. The method of manufacturing of claim 11, wherein the placing comprises placing the first LEDs and second LEDs in a substantially square array on the substrate.

15. The method of manufacturing of claim 1, wherein at least one of the first LED and the second LED is selected from the group consisting of a flip chip, a vertical chip, and a lateral chip.

16. The method of manufacturing of claim 1, further comprising disposing a diffusing layer over the first photoluminescence material.

17. A method of manufacturing a white light emitting device, comprising the steps of:
providing a substrate;
providing first LEDs and second LEDs operable to generate excitation light having a dominant wavelength in a range from 440 nm to 480 nm;
affixing the first and second LEDs to the substrate;
providing a first photoluminescence material which generates light having a peak emission wavelength in a range from 500 nm to 590 nm;
providing a second photoluminescence material which generates light having a peak emission wavelength in a range from 600 nm to 650 nm;
depositing the second photoluminescence material as a first layer over and into direct contact with the second LEDs; and
depositing the first photoluminescence material as a second layer, separate from the first layer, over the first LEDs and second LEDs.

18. The method of manufacturing of claim 17, wherein the second LEDs include light emitting faces generally orthogonal to the substrate, and wherein the depositing the second photoluminescence material includes depositing the second photoluminescence material against the light emitting faces of the second LEDs generally orthogonal to the substrate.

19. A method of manufacturing a white light emitting device, comprising the steps of:
providing a substrate having a continuous wall defined around the perimeter thereof, the wall having a top edge;
providing first LEDs and second LEDs operable to generate excitation light having a dominant wavelength in a range from 440 nm to 480 nm;
electrically connecting the first and second LEDs to the substrate;
providing a first photoluminescence material which generates light having a peak emission wavelength in a range from 500 nm to 590 nm;
providing a second photoluminescence material which generates light having a peak emission wavelength in a range from 600 nm to 650 nm;
depositing the second photoluminescence material as a first layer over and into direct contact with the second LEDs; and
depositing the first photoluminescence material as a second layer, separate from the first layer, over the first LEDs and second LEDs, wherein the second layer substantially extends to the top edge of the wall.

20. The method of manufacturing of claim 19, further comprising, prior to the depositing, dispersing in a first portion of silicone the first photoluminescence material, and dispersing in a second, separate portion of silicone the second photoluminescence material.

* * * * *